US007015731B2

(12) United States Patent  (10) Patent No.: US 7,015,731 B2
Seo                              (45) Date of Patent:     Mar. 21, 2006

(54) CMOS OUTPUT BUFFER CIRCUIT

(75) Inventor: Jun Ho Seo, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 45 days.

(21) Appl. No.: 10/879,301

(22) Filed: Jun. 30, 2004

(65) Prior Publication Data

US 2005/0093585 A1    May 5, 2005

(30) Foreign Application Priority Data

Oct. 31, 2003  (KR) ..................... 10-2003-0076767

(51) Int. Cl.
    *H03B 1/00*     (2006.01)
(52) U.S. Cl. ..................... 327/112; 327/108; 327/170
(58) Field of Classification Search ................ 327/112, 327/170, 380
    See application file for complete search history.

(56) References Cited

U.S. PATENT DOCUMENTS 5,773,999 A * 6/1998 Park et al. ................. 327/112
6,011,416 A * 1/2000 Mizuno et al. ............. 327/108
6,351,157 B1 * 2/2002 Sharpe-Geisler ........... 327/112

FOREIGN PATENT DOCUMENTS

JP            09-270698       10/1997

* cited by examiner

*Primary Examiner*—Long Nguyen
(74) *Attorney, Agent, or Firm*—Heller Ehrman LLP

(57) ABSTRACT

A CMOS output buffer circuit comprises an input unit, a compensation control unit, a first switching unit and a second switching unit. The input unit outputs a data signal in response to a stop signal for determining transmission of the data signal. The compensation control unit determines a power voltage level with reference to the stop signal and the data signal when the data signal is transmitted, and outputs a plurality of compensating signals depending on the power voltage level. The first switching unit including a driving unit driven by the data signal outputted from the input unit and a compensation driving unit driven by combination of the data signal and the plurality of compensating signals compensates change of the power voltage level to output current. The second switching unit operated complementarily with the first switching unit outputs current. Accordingly, the CMOS output buffer circuit supplies a predetermined output current regardless change of a power voltage, thereby reducing power consumption and minimizing overshoot/undershoot noise to stabilize a power supplied to a device.

9 Claims, 6 Drawing Sheets

CMOS OUTPUT BUFFER CIRCUIT

BACKGROUND OF THE INVENTION

1. Field of the Invention

The present invention generally relates to a CMOS output buffer unit, and more specifically, to a technology of providing a predetermined output current regardless of change of a power voltage, thereby stabilizing power.

2. Description of the Prior Art

Generally, a Complementary Metal Oxide Semiconductor (hereinafter, referred to as "CMOS") output buffer circuit comprises a plurality of CMOS transistors connected in parallel each including a P-channel Metal Oxide Semiconductor (hereinafter, referred to as "PMOS") Transistor and a N-channel Metal Oxide Semiconductor (hereinafter, referred to as "NMOS") Transistor.

FIG. 1 is a circuit diagram of a conventional CMOS output buffer circuit.

The conventional CMOS output buffer circuit comprises an inverter IN1, a NAND gate NAND1, a buffer BUF1, a PMOS transistor PM1 and a NMOS transistor NM1.

The NAND gate NAND1 outputs a high level signal regardless of a level of a data signal DATA if a stop signal STOP is at a high level. The buffer BUF1 buffers the high level signal outputted from the NAND gate NAND1, and the NMOS transistor NM1 driven by an output signal from the buffer BUF1 outputs an output signal OUT having a low level.

Meanwhile, the CMOS output buffer circuit outputs the output signal OUT in response to the data signal DATA if the stop signal STOP is at a low level. If the data signal DATA is at a high level, the PMOS transistor PM1 is driven and the CMOS output buffer circuit outputs the output signal OUT having a high level. If the data signal DATA is at a low level, the NMOS transistor NM1 is driven and the CMOS output buffer circuit outputs the output signal OUT at a low level.

In the above-described conventional CMOS output buffer circuit, if a power voltage VDD increases, current flowing through the PMOS transistor PM1 dramatically increases. As a result, the output current becomes temporarily unstable depending on toggling of the data signal DATA.

FIG. 2 is a timing diagram of a conventional CMOS output buffer circuit.

As shown in FIG. 2, in an interval where the stop signal STOP is at a low level and the data signal DATA is normally outputted, the change (ranging from 22 mA to 66 mA) of the current driving ability of output signal OUT from the CMOS output buffer circuit depending on change of the power voltage VDD is shown to be large.

If the output signal OUT having unstable current driving ability of is used as base current of a NPN-bipolar transistor, the change amount of collector current which is output current of the amplified NPN-bipolar transistor becomes larger.

Furthermore, the semiconductor memory device using the large change amount of output current has unstable power and causes mis-operations.

SUMMARY OF THE INVENTION

Accordingly, it is an object of the present invention to prevent mis-operations of a semiconductor memory device by providing a predetermined output current regardless of change of a power voltage to supply a stable power to the semiconductor memory device.

In an embodiment, a CMOS output buffer circuit comprises an input unit, a compensation control unit, a first switching unit and a second switching unit. The input unit outputs a data signal in response to a stop signal for determining transmission of the data signal. The compensation control unit determines a power voltage level with reference to the stop signal and the data signal when the data signal is transmitted, and for outputs a plurality of compensating signals depending on the power voltage level. The first switching unit including a driving unit driven by the data signal outputted from the input unit and a compensation driving unit driven by combination of the data signal and the plurality of compensating signals to compensates change of the power voltage level to output current. The second switching unit operated complementarily with the first switching unit outputs current.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
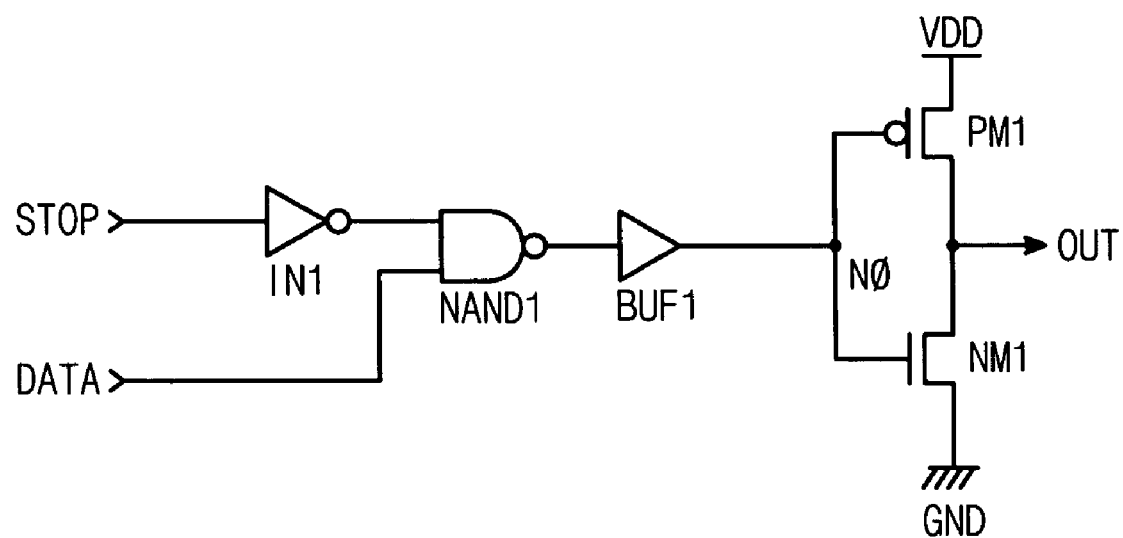
FIG. 1 is a circuit diagram of a conventional CMOS output buffer circuit.
Figure 2:
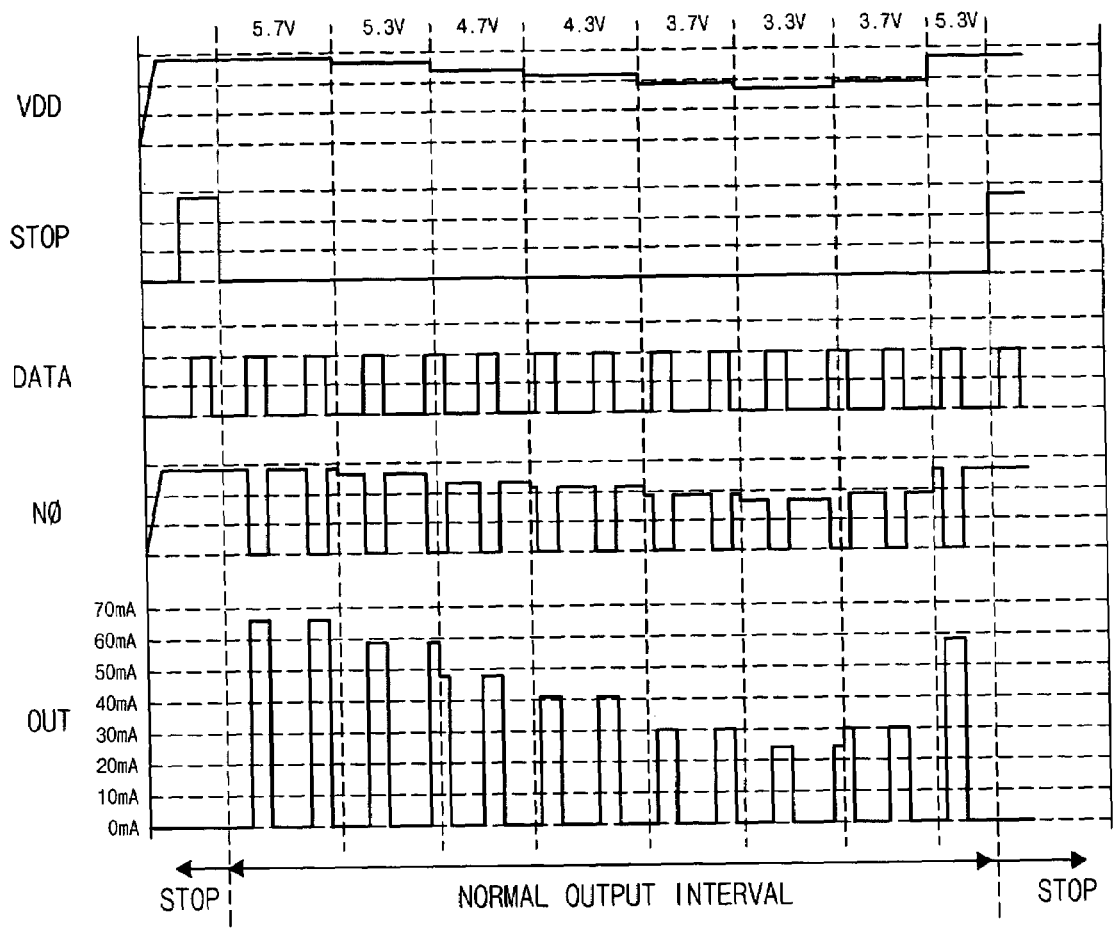
FIG. 2 is a timing diagram of a conventional CMOS output buffer circuit.
Figure 3:
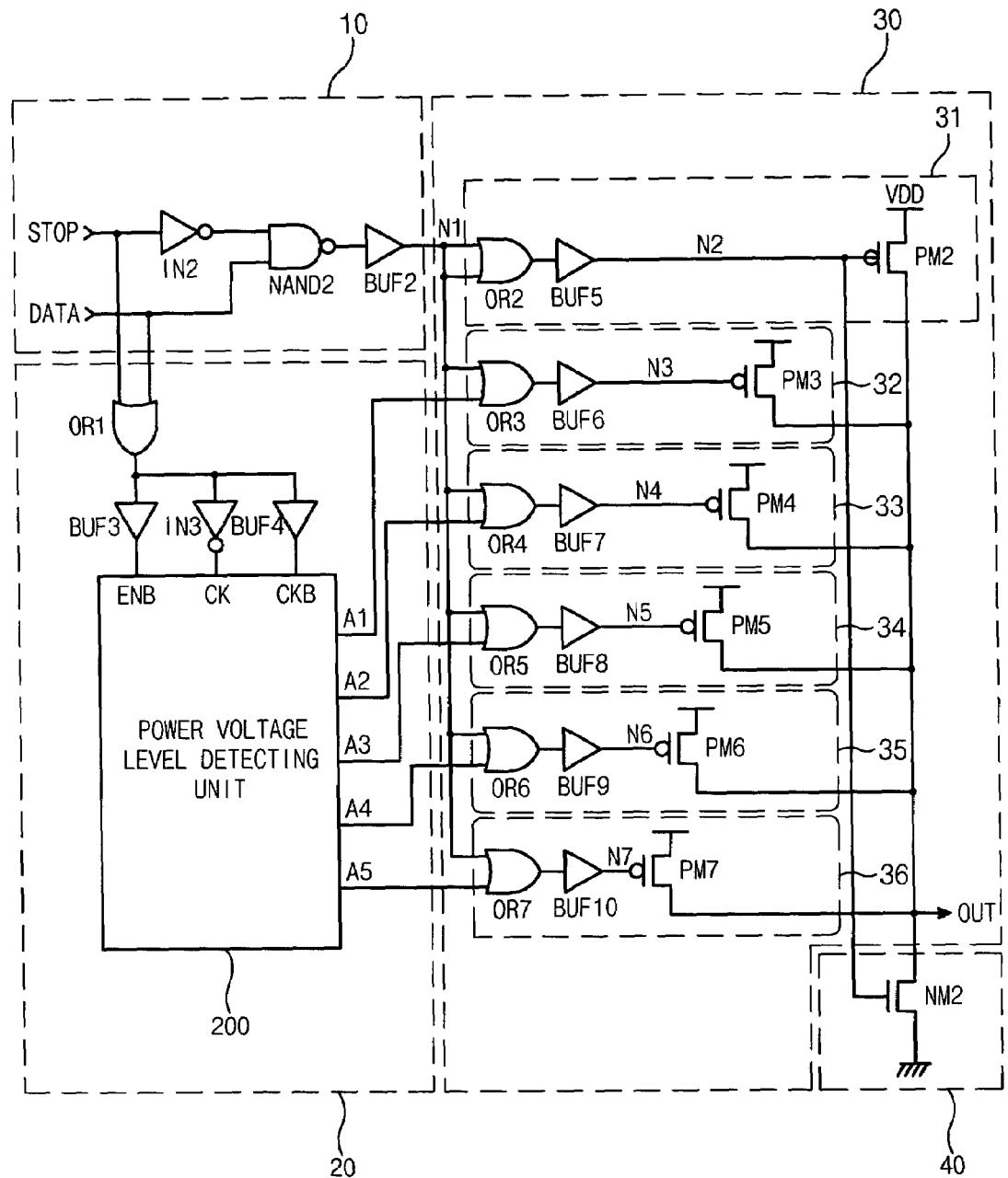
FIG. 3 is a circuit diagram of a CMOS output buffer circuit according to an embodiment of the present invention.

FIG. 3 is a circuit diagram of a CMOS output buffer circuit according to an embodiment of the present invention.

In an embodiment, the CMOS output buffer circuit comprises an input unit 10, a compensation control unit 20, a first switching unit 30 and a second switching unit 40.

The input unit 10 comprises an inverter IN2, a NAND gate NAND2 and a buffer BUF2.

The inverter IN2 inverts a stop signal STOP, and the NAND gate NAND2 performs a NAND operation on an output signal from the inverter IN2 and a data signal DATA. The buffer BUF2 buffers an output signal from the NAND gate NAND2.

The compensation control unit 20 comprises an OR gate OR1, buffers BUF3 and BUF4, an inverter IN3 and a power voltage level detecting unit 200.

The OR gate OR1 performs an OR operation on the stop signal STOP and the data signal DATA. The buffers BUF3 and BUF4 connected in parallel buffer an output signal from the OR gate OR1, respectively. The inverter IN3 inverts the output signal from the OR gate OR, and outputs the inverts signal to the power voltage level detecting unit 200.

The power voltage level detecting unit 200 is disabled if the stop signal STOP is at a high level, and enabled if the stop signal STOP is at a low level.

If the stop signal STOP is at the low level, and the data signal DATA is at a low level, the buffer BUF3 outputs a low level signal to an enable terminal ENB to enable the power voltage level detecting unit 200, and the inverter IN3 outputs a high level signal to a clock terminal CKB. The power voltage level detecting unit 200 detects and latches the power voltage level synchronously with respect to the clock terminal CKB.

Thereafter, if the data signal DATA having the low level transits to a high level, the power voltage level detecting unit 200 outputs compensating signals A1~A5 to the first switching unit 30.

The first switching unit 30 comprises a driving unit 31 and a plurality of compensation driving units 32~36.

The driving unit 31 and the compensation driving units 32~36 comprise OR gates OR2~OR7, buffers BUF5~BUF10 and PMOS transistors PM2~PM7.

The driving unit 31 is driven by an output signal from the input unit 10, and the compensation driving units 32~36 are driven by combination of the output signal from the input unit 10 and the compensating signals A1~A5 outputted from the power voltage level detecting unit 200.

The driving unit 31 comprises the OR gate OR2, the buffer BUF5 and the PMOS transistor PM2. The OR gate OR2 performs an OR operation on the output signal from the input unit10. The buffer BUF5 buffers an output signal from the OR gate OR2. The PMOS transistor PM2 outputs a power voltage VDD level depending on an output signal from the buffer BUF5.

The above-described driving unit 31 is constantly driven if the stop signal STOP is at the low level and the data signal DATA is at the high level. The compensation driving units 32~36 have the same structure as that of the driving unit 31 except that they are driven depending on change of the power voltage level.

For example, if the power voltage level is over 5.5V, only the driving unit 31 is driven. If the power voltage level ranges from 5.0V~5.5V, the driving unit 31 and the compensation driving unit 32 are driven. If the power voltage ranges from 4.5V~5.0V, the driving unit 31 and the compensation driving units 32 and 33 are driven. If the power voltage ranges from 4.0V~4.5V, the driving unit 31 and the compensation driving units 32~34 are driven. If the power voltage ranges from 3.5V~4.0V, the driving unit 31 and the compensation driving units 32~35 are driven. If the power voltage ranges from 3.0V~3.5V, the driving unit 31 and the compensation driving units 32~36 are driven.

The second switching unit 40 is a NMOS transistor NM2 having a drain connected to the driving unit 31 and the plurality of compensation driving units 32~36 and a source to receive a ground voltage. The NMOS transistor NM2 outputs a ground voltage VSS level depending on an output signal from the buffer BUF5.

The second switching unit 40 is constantly driven regardless of the data signal DATA when the stop signal STOP is at the high level, and outputs an output signal OUT having a low level. If the stop signal STOP becomes at the low level, the second switching unit 40 is driven when the data signal DATA is at the low level.

In this way, the CMOS output buffer circuit according to an embodiment of the present invention comprises a plurality of PMOS transistors PM2~PM7 for driving large current which are connected in parallel. Here, one PMOS transistor PM2 is the base, and the rest PMOS transistors PM3~PM7 are turned on depending on change of the power voltage level. As a result, the CMOS output buffer circuit outputs output current having a predetermined level regardless of change of the power voltage level.

Figure 4:
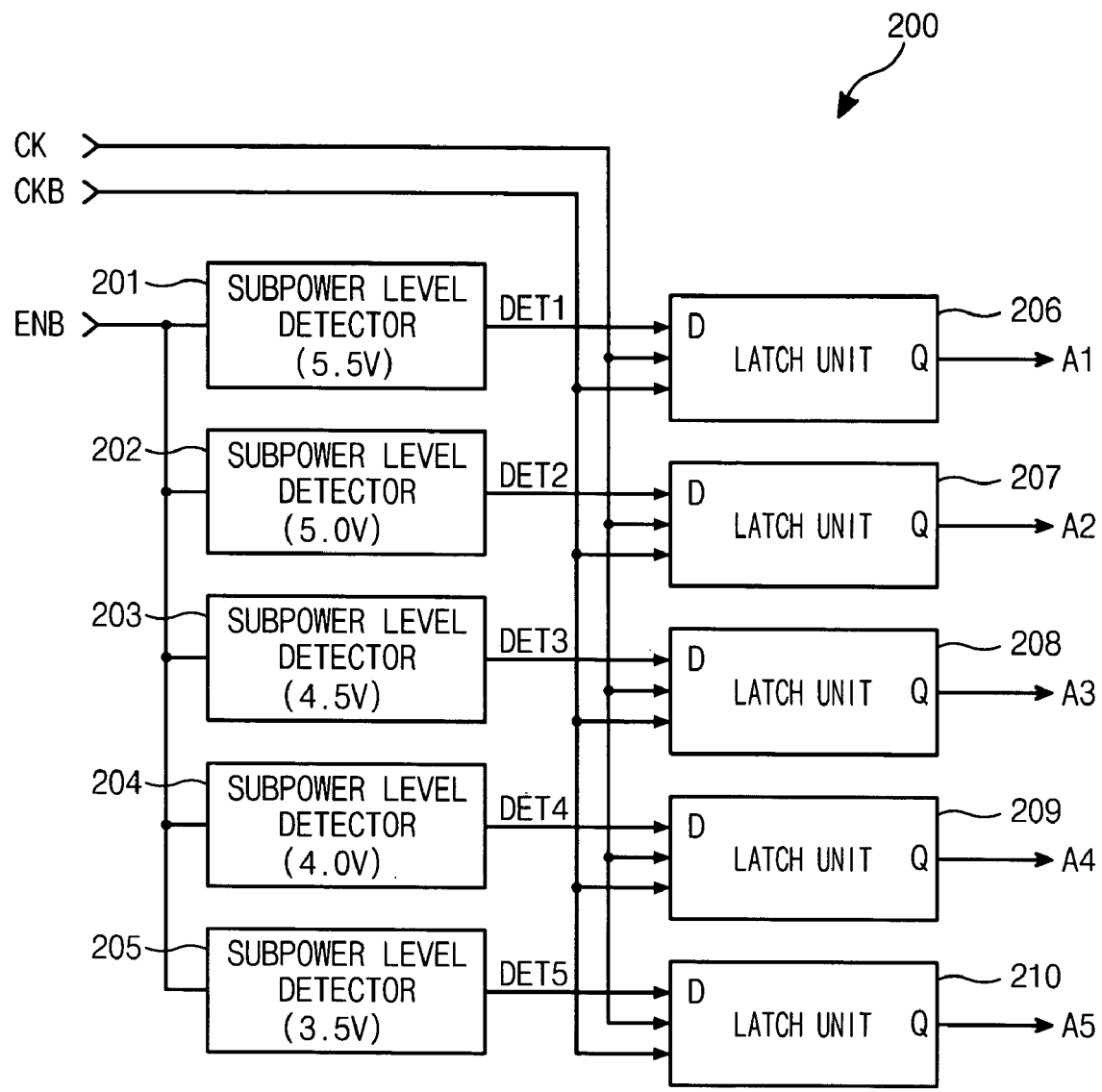
FIG. 4 is a diagram of a power voltage level detecting unit of FIG. 3.

FIG. 4 is a diagram of the power voltage level detecting unit 200 of FIG. 3.

The power voltage level detecting unit 200 comprises a plurality of sub-power level detectors (hereinafter, referred to as "PLD") 201~205 and a plurality of latch units 206~210.

The plurality of PLDs 201~205, which are enabled if the data signal DATA becomes at the low level, detect a level of the power voltage, and outputs detecting signals DET1~DET5 depending on the detected level of the power voltage.

The PLD 201 outputs the detecting signal DET1 when the detected power voltage ranges from 5.0V~5.5V. The PLD 202 outputs the detecting signal DET2 when the detected power voltage ranges from 4.5V~5.0V. The PLD 203 outputs the detecting signal DET3 when the detected power voltage ranges from 4.0V~4.5V. The PLD 204 outputs the detecting signal DET4 when the detected power voltage ranges from 3.5V~4.0V. The PLD 205 outputs the detecting signal DET5 when the detected power voltage ranges from 3.0V~3.5V.

The latch units 206~210 latch the detecting signals DET1~DET5, respectively, and then output the compensating signals A1~A5 in response to signals applied to clock terminals CK and CKB if the data signal DATA becomes at the high level.

Figure 5:
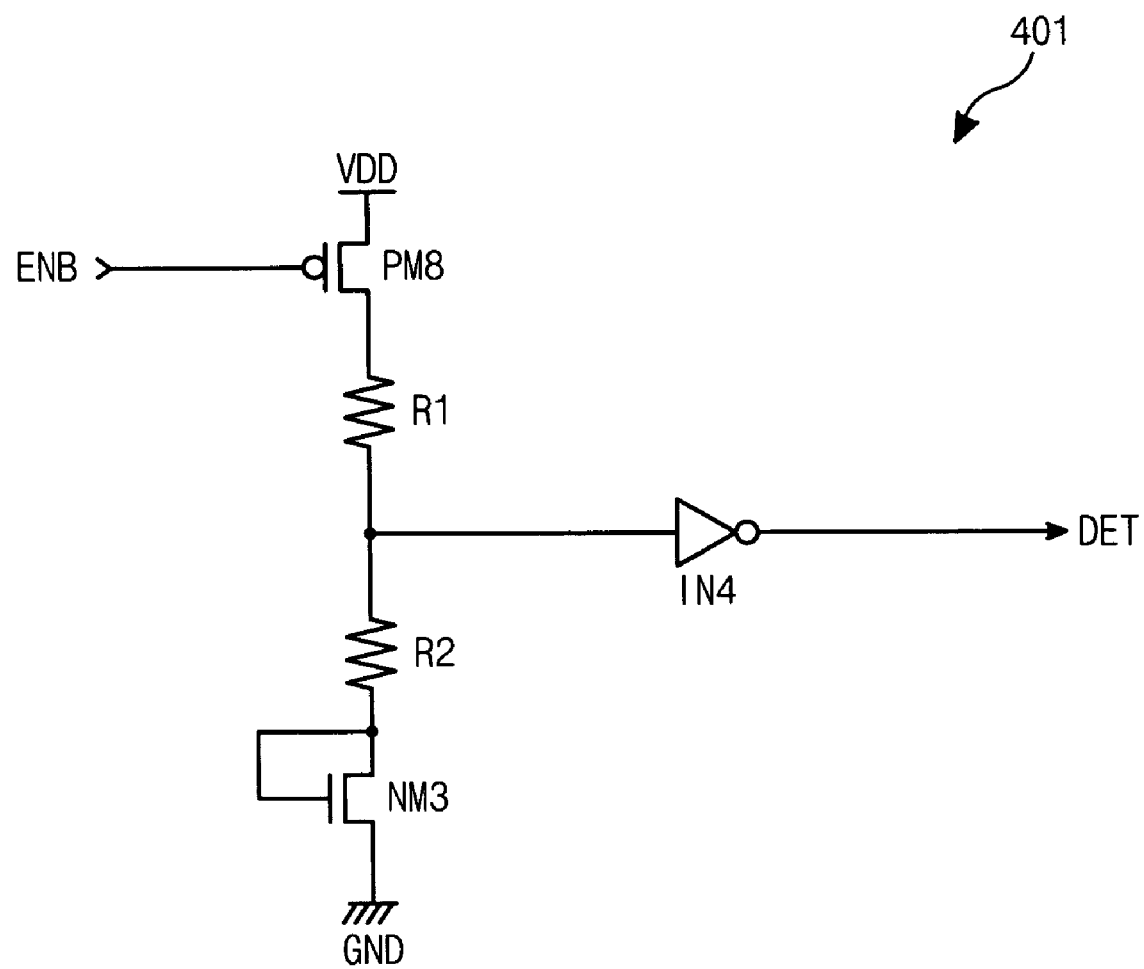
FIG. 5 is a circuit diagram of a sub-power level detector of FIG. 4.

FIG. 5 is a circuit diagram of one of the sub-power level detectors 201~205 of FIG. 4.

Each of the PLDs 201~205 comprises a PMOS transistor PM8, resistors R1 and R2, a NMOS transistor NM3 and an inverter IN4.

The PMOS transistor PM8 is controlled by a signal inputted to the enable terminal ENB, and has a source to receive the power voltage VDD and a drain connected to one side of the resistor R1.

The resistors R1 and R2 are connected serially. One side of the resistor R1 is connected to the drain of the PMOS transistor PM8, and one side of the resistor R2 is connected to a drain of the NMOS transistor NM3.

The NMOS transistor NM3 has a source to receive a ground voltage, and a gate and a drain which are connected each other. The inverter IN4 is connected to the common node of the resistors R1 and R2.

The PMOS transistor PM8 is turned on when the stop signal STOP and the data signal DATA are at the low level, and turned off when the stop signal STOP is at the low level and the data signal DATA is at the high level.

Here, an output signal from the inverter IN4 becomes at a high level if the power voltage VDD is higher than a reference voltage, and at a low level if the power voltage VDD is lower than the reference voltage. For example, in case of the PLD 201, when the reference voltage is 5.5V, the detecting signal DET1 becomes at a high level if the power voltage VDD is over 5.5V, and at a low level if the power voltage VDD is below 5.5V.

In the above-described PLDs 201~205, values of the reference voltage are regulated depending on the detected power voltage and the ratio of the resistors R1 and R2. As a result, the PLD can be embodied depending on the level change of the power voltage by regulating values of the resistors R1 and R2 and a width and length W/L of the NMOS transistor NM3.

Figure 6:
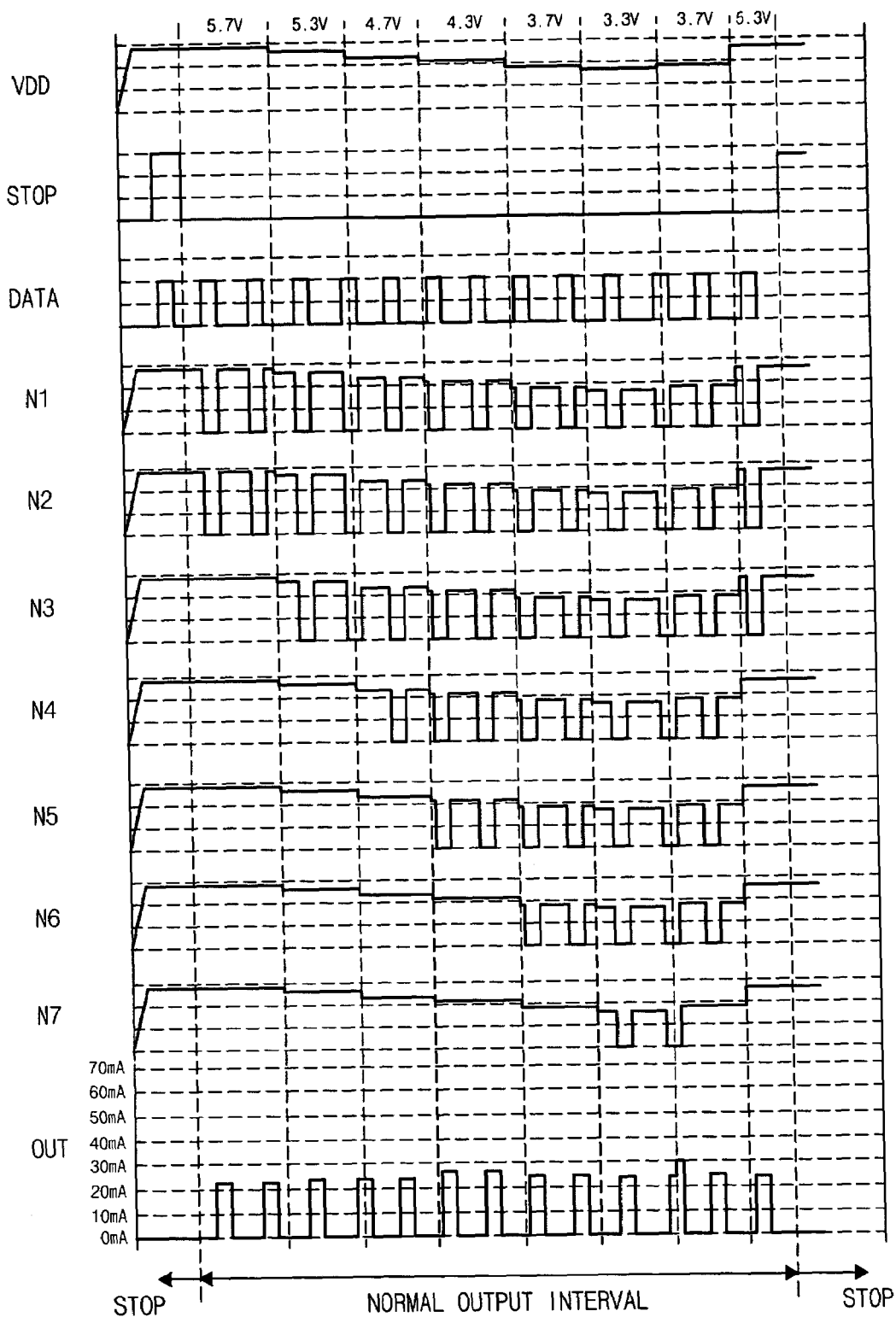
FIG. 6 is a timing diagram of a CMOS output buffer circuit according to an embodiment of the present invention.

FIG. 6 is a timing diagram of a CMOS output buffer circuit according to an embodiment of the present invention.

In an embodiment, the CMOS output buffer circuit constantly turns on the NMOS transistor NM2 and turns off the PMOS transistors PM2~PM7 regardless of the level of the data signal DATA if the stop signal STOP is at the high level.

Also, the CMOS output buffer circuit disables the power voltage level detecting unit 200, thereby removing stand-by current.

The CMOS output buffer circuit controls the operations of the PMOS transistors PM2~PM7 and the NMOS transistor NM2 depending on the level of the data signal DATA if the stop signal STOP becomes at the low level.

More specifically, if the stop signal STOP and the data signal DATA are at the low level, a node N1 becomes at a high level and a node N2 also becomes at a high level. As a result, the PMOS transistor PM2 is turned off and the NMOS transistor NM2 is turned on so that the CMOS output buffer circuit outputs the output signal OUT having a low level. Here, the power voltage level detecting unit 200 is enabled, detects the level of the power voltage VDD, latches the detecting signals DET1~DET5 depending on the power voltage level, and outputs the compensating signals A1~A5 depending on the detected level of the power voltage level.

Here, the detecting signals DET1~DET5 depend on the detection basis of the power voltage level, for example, ranging from 5.0V to 5.5V, from 4.5V to 5.0V, from 4.0V to 4.5V, from 3.5V to 4.0V and from 3.0V to 3.5V, respectively. The detection level can be more subdivided by a user.

Meanwhile, if the stop signal STOP becomes at the low level and the data signal DATA becomes at the high level, the nodes N1 and N2 become at a low level, and the PMOS transistor PM2 is turned on. Additionally, the power voltage level detecting unit 200 outputs the compensating signals A1~A5 in response to the detecting signals DET1~DET5 latched by the detected level of the power voltage VDD.

When the power voltage level is over 5.5V, the compensating signals A1~A5 become all at a high level, and the PMOS transistors PM3~PM7 are turned off. As a result, only the PMOS transistor PM2 is driven. When the power voltage level ranges from 5.0V~5.5V, only the compensating signal A1 becomes at a low level, and the PMOS transistors PM2 and PM3 are driven. When the power voltage level ranges from 4.5V~5.0V, the compensating signals A1 and A2 become at the low level, and the PMOS transistors PM2~PM4 are driven. When the power voltage level ranges from 4.0V~4.5V, the compensating signals A1~A3 become at the low level, and the PMOS transistors PM2~PM5 are driven. When the power voltage level ranges from 3.5V~4.0V, the compensating signals A1~A4 become at the low level, and the PMOS transistors PM2~PM6 are driven. When the power voltage level ranges from 3.0V~3.5V, the compensating signals A1~A5 become at the low level, and the PMOS transistors PM2~PM7 are driven. As a result, the CMOS output buffer circuit outputs the output signal OUT at the high level.

Table 1 shows the above-described operation of the CMOS output buffer circuit.

TABLE 1

| Power voltage VDD (V) | N1 = N2 | N3 | N4 | N5 | N6 | N7 | Number of driven PMOS |
|---|---|---|---|---|---|---|---|
| 5.7 | L | H | H | H | H | H | 1 |
| 5.3 | L | L | H | H | H | H | 2 |
| 4.7 | L | L | L | H | H | H | 3 |
| 4.3 | L | L | L | L | H | H | 4 |
| 3.7 | L | L | L | L | L | H | 5 |
| 3.3 | L | L | L | L | L | L | 6 |

In this way, the power voltage level detecting unit 200 outputs the compensating signals A1~A5 depending on the detected level of the power voltage, and switches the PMOS transistors PM3~PM7 of the compensation driving units 32~36 in response to the compensating signals A1~A5. As a result, the number of turned-on PMOS transistors increases or decreases in inverse proportion to the power voltage level.

As shown in FIG. 6, since the compensation driving unit is operated depending on the level of the power voltage VDD, the change amount of the output signal OUT becomes smaller ranging from 19 mA to 31 mA.

As discussed earlier, a CMOS output buffer circuit according to an embodiment of the present invention supplies a predetermined output current regardless change of a power voltage, thereby reducing power consumption and minimizing overshoot/undershoot noise to stabilize a power supplied to a device.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A CMOS output buffer circuit comprising:
   an input unit for transmitting a data signal in response to a stop signal for;
   a compensation control unit for determining a power voltage level in response to the stop signal and the data signal when the data signal is transmitted and for outputting a plurality of compensating signals depending on the power voltage level;
   a first switching unit to output first current, wherein the first switching unit a driving unit comprises driven by an output data signal outputted from the input unit and a compensation driving unit driven by combination of the output data signal and the plurality of compensating signals to compensate change of the power voltage level; and
   a second switching unit operated to output a second current complementarily with the first switching unit.

2. The circuit according to claim 1, wherein the compensation control unit comprises:
   a logic operation unit for performing a logic operation on the stop signal and the data signal;
   a plurality of buffers for buffering an output signal from the logic operation unit;
   an inverting unit for inverting the output signal from the logic operation unit; and
   a power voltage level detecting unit enabled by an output signal from one of the plurality of buffers when the data signal is at a low level, to detect and latch the power voltage level by using an output signal from the inverting unit as a clock and to output the plurality of compensating signals when the data signal is at a high level.

3. The circuit according to claim 2, wherein the power voltage level detecting unit comprises:
   a plurality of sub-power level detectors enabled when the stop signal and the data signal are at the low level, to detect the power voltage level and to output a plurality of detecting signals depending on the power voltage level; and a plurality of latch units for latching the plurality of detecting signals and outputting the plurality of compensating signals when the data signal is at the high level.

4. The circuit according to claim 3, wherein each of the plurality of the sub-power level detectors comprises:
 a PMOS transistor having a source connected to a power voltage and controlled by the output signal from the one of the plurality of buffers;
 a first resistor having one side connected to a drain of the PMOS transistor;
 a second resistor having one side connected to the other side of the first resistor;
 an NMOS transistor having a gate and a drain connected to the other side of the second resistor, and a source to receive a ground voltage; and
 an inverting unit for inverting an output signal from the common node of the first resistor and the second resistor.

5. The circuit according to claim 4, wherein said each of the plurality of the sub-power level detectors generates a reference voltage based on the first resistor, the second resistor and the NMOS transistor, and detects the power voltage level by comparing the power voltage with the generated reference voltage.

6. The circuit according to claim 1, wherein the compensation driving unit comprises:
 a first compensation driving unit switched by a first compensating signal of the plurality of compensating signals corresponding to the power voltage level of 5.0V~5.5V when the data signal is transmitted;
 a second compensation driving unit switched by a second compensating signal of the plurality of compensating signals corresponding to the power voltage level of 4.5V~5.0V when the data signal is transmitted;
 a third compensation driving unit switched by a third compensating signal of the plurality of compensating signals corresponding to the power voltage level of 4.0V~4.5V when the data signal is transmitted;
 a fourth compensation driving unit switched by a fourth compensating signal of the plurality of compensating signals corresponding to the power voltage level of 3.5V~4.0V when the data signal is transmitted; and
 a fifth compensation driving unit switched by a fifth compensating signal of the plurality of compensating signals corresponding to the power voltage level of 3.0V~3.5V when the data signal is transmitted.

7. The circuit according to claim 6, wherein each of the first to the fifth compensation driving units comprises:
 a logic operation unit for performing a logic operation on the respective corresponding compensating signal;
 a buffer for buffering an output signal from the logic operation unit; and
 a PMOS transistor switched by an output signal from the buffer.

8. The circuit according to claim 1, wherein the driving unit comprises:
 a logic operation unit for performing a logic operation on the output data signal from the input unit;
 a buffer for buffering an output signal from the logic operation unit; and
 a PMOS transistor switched by an output signal from the buffer.

9. The circuit according to claim 1, wherein the second switching unit is an NMOS transistor.

* * * * *